United States Patent
Harutyunyan et al.

(10) Patent No.: US 10,816,904 B2
(45) Date of Patent: Oct. 27, 2020

(54) METHOD FOR DETERMINING CONTRIBUTION TO A FINGERPRINT

(71) Applicant: ASML NETHERLANDS B.V., Veldhoven (NL)

(72) Inventors: Davit Harutyunyan, Kranenburg (DE); Fei Jia, Eindhoven (NL); Frank Staals, Eindhoven (NL); Fuming Wang, Santa Clara, CA (US); Hugo Thomas Looijestijn, Eindhoven (NL); Cornelis Johannes Rijnierse, Eindhoven (NL); Maxim Pisarenco, Son en Breugel (NL); Roy Werkman, Eindhoven (NL); Thomas Theeuwes, Veldhoven (NL); Tom Van Hemert, Veldhoven (NL); Vahid Bastani, Eindhoven (NL); Jochem Sebastiaan Wildenberg, Aarle-Rixtel (NL); Everhardus Cornelis Mos, Best (NL); Erik Johannes Maria Wallerbos, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/461,044

(22) PCT Filed: May 23, 2018

(86) PCT No.: PCT/EP2018/063527
§ 371 (c)(1),
(2) Date: May 15, 2019

(87) PCT Pub. No.: WO2018/233966
PCT Pub. Date: Dec. 27, 2018

(65) Prior Publication Data
US 2019/0271919 A1    Sep. 5, 2019

Related U.S. Application Data

(60) Provisional application No. 62/523,531, filed on Jun. 22, 2017, provisional application No. 62/639,481, filed on Mar. 6, 2018.

(51) Int. Cl.
*G03F 7/20* (2006.01)
*G05B 13/04* (2006.01)
*H01L 21/66* (2006.01)

(52) U.S. Cl.
CPC .......... *G03F 7/70525* (2013.01); *G03F 7/705* (2013.01); *G03F 7/70491* (2013.01);
(Continued)

(58) Field of Classification Search
None
See application file for complete search history.

(56) References Cited

U.S. PATENT DOCUMENTS 5,611,059 A * 3/1997 Benton .............. G05B 19/0426
715/734
5,825,673 A * 10/1998 Watanabe ............. G06F 30/367
703/14
(Continued)

FOREIGN PATENT DOCUMENTS

| EP | 3290911 | 3/2018 |
|---|---|---|
| WO | 2016162231 | 10/2016 |

OTHER PUBLICATIONS

International Search Report and Written Opinion issued in corresponding PCT Patent Application No. PCT/EP2018/063527, dated Aug. 21, 2018.
(Continued)

*Primary Examiner* — Ramesh B Patel
(74) *Attorney, Agent, or Firm* — Pillsbury Winthrop Shaw Pittman LLP

(57) ABSTRACT

A method, system and program for determining a fingerprint of a parameter. The method includes determining a contribution from a device out of a plurality of devices to a fingerprint of a parameter. The method including: obtaining parameter data and usage data, wherein the parameter data is based on measurements for multiple substrates having been processed by the plurality of devices, and the usage
(Continued)

data indicates which of the devices out of the plurality of the devices were used in the processing of each substrate; and determining the contribution using the usage data and parameter data.

26 Claims, 2 Drawing Sheets

(52) U.S. Cl.
CPC ....... *G03F 7/70616* (2013.01); *G05B 13/042* (2013.01); *H01L 22/20* (2013.01)

(56) References Cited

U.S. PATENT DOCUMENTS

| | | | | |
|---|---|---|---|---|
| 6,477,685 | B1* | 11/2002 | Lovelace | H01L 22/20 257/E21.525 |
| 6,842,230 | B2* | 1/2005 | Takakuwa | G03F 7/70258 355/52 |
| 10,274,834 | B2* | 4/2019 | Ypma | G03F 7/70508 |
| 10,571,806 | B2* | 2/2020 | Tel | G03F 7/70625 |
| 2015/0079700 | A1* | 3/2015 | Ke | G03F 1/36 438/5 |
| 2016/0246185 | A1* | 8/2016 | Ypma | G03F 7/70616 |
| 2018/0067900 | A1* | 3/2018 | Mos | G03F 7/70633 |
| 2018/0307145 | A1* | 10/2018 | Mos | G03F 7/705 |
| 2019/0187569 | A1* | 6/2019 | Ypma | G03F 7/70633 |
| 2020/0026200 | A1* | 1/2020 | Wildenberg | G03F 7/70633 |

OTHER PUBLICATIONS

Lee, Hong-Goo, et al.: "Reduction of in-lot overlay variation with integrated metrology, and a holistic control strategy", Proc. of SPIE, vol. 9635, 2015.

Lam, Auguste, et al.: "Pattern recognition and data mining techniques to identify factors in wafer processing and control determining overlay error", Proc. of SPIE, vol. 9424, 2015.

Hansen, P.C.: "The L-curve and its use in numerical treatment of inverse problems", Computational Inverse Problems in Electrocardiology, Advances in Computational Bioengineering, 2005.

* cited by examiner

METHOD FOR DETERMINING CONTRIBUTION TO A FINGERPRINT

CROSS-REFERENCE TO RELATED APPLICATIONS

This application is the U.S. national phase entry of PCT patent application no. PCT/EP2018/063527, which was filed on May 23, 2018, which claims the benefit of priority of U.S. provisional application No. 62/523,531, which was filed on Jun. 22, 2017, and U.S. provisional application No. 62/639,481, which was filed on Mar. 6, 2018, each of which is incorporated herein in its entirety by reference.

FIELD

The present description relates to a method, system and program for determining contribution to a fingerprint of a parameter.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In lithographic processes, it is desirable to frequently measure the structures created forming a circuit pattern, e.g., for process control and verification. Various tools for making such measurements are known, including scanning electron microscopes, which are often used to measure critical dimension (CD), and specialized tools to measure overlay (which is the accuracy of alignment of two layers in an at least partially patterned substrate). Various techniques can be used to measure performance of the lithographic process. This in turn allows sophisticated process corrections to be included in the control of the operations performed by the lithographic apparatus.

SUMMARY

After exposure of the substrate, i.e. when the patent is transferred under the substrate, various different processes can be carried out on the substrate. Thus, different processing tools may be used on a substrate. However, each processing tool may slightly vary the overlay fingerprint. There are methods of reducing the effects of variations induced by processing tools, for example by adjusting lithographic apparatus actuators and improving the control. However, each substrate may be provided with the same correction meaning that the variation induced on each substrate is not individually dealt with.

One issue is that a number of different devices may be provided to carry out the processing of a substrate. There may be a number of different types of device used to process a substrate in different ways, e.g. an etching device and a polishing device. Additionally, there may multiple of the same type of device available to be used for each substrate. Thus, there may be multiple etching and/or polishing devices which could be used on each substrate and each substrate may be processed using a different combination of devices from a plurality of devices. Each of the devices may have a different effect on the fingerprint of a parameter and it is not necessarily clear what the effect of an individual device is on the parameter of the substrate.

An embodiment of the present invention has, for example, an aim of determining a contribution from a device out of a plurality of devices to a fingerprint of a parameter, the parameter being associated with processing of a substrate.

According to an aspect, there is provided a method for determining a contribution of a device out of a plurality of devices to a fingerprint of a parameter, the parameter being associated with processing of a substrate, the method comprising: obtaining parameter data and usage data, wherein the parameter data is based on measurements for multiple substrates having been processed by the plurality of devices, and the usage data indicates which of the devices out of the plurality of the devices were used in the processing of each substrate; and determining the contribution using the usage data and parameter data.

According to an aspect, there is provided a system comprising a processor configured to determine a contribution of a device out of a plurality of devices to a fingerprint of a parameter, the parameter being associated with processing of a substrate, the processor being configured to: obtain parameter data and usage data, wherein the parameter data is based on measurements for multiple substrates having been processed by the plurality of devices, and the usage data indicates which of the devices out of the plurality of devices were used in the processing of each substrate; and determine the contribution using the usage data and the parameter data.

According to an aspect, there is provided a program for controlling determining a contribution of a device out of a plurality of devices to a fingerprint of a parameter, the parameter being associated with processing of a substrate, the program comprising instructions for carrying out a method comprising: obtaining parameter data and usage data, wherein the parameter data is based on measurements for multiple substrates having been processed by the plurality of devices, and the usage data indicates which of the devices out of the plurality of devices were used in the processing of each substrate; and determining the contribution using the usage data and the parameter data.

BRIEF DESCRIPTION OF THE DRAWINGS

Embodiments of the invention will now be described, by way of example only, with reference to the accompanying schematic drawings in which.

DETAILED DESCRIPTION OF EXEMPLARY EMBODIMENTS

Before describing embodiments of the invention in detail, it is instructive to present an example environment in which embodiments of the present invention may be implemented. The invention can be applied, for example, after at least partial processing of a substrate in a lithographic manufacturing process. The invention can be applied for example to determine the effect of a device which is part of a lithographic apparatus. A lithographic process for the manufacture of semiconductor devices will be described to provide an exemplary context in which the method can be used. The principles of the present disclosure can be applied in other processes without limitation.

Figure 1:
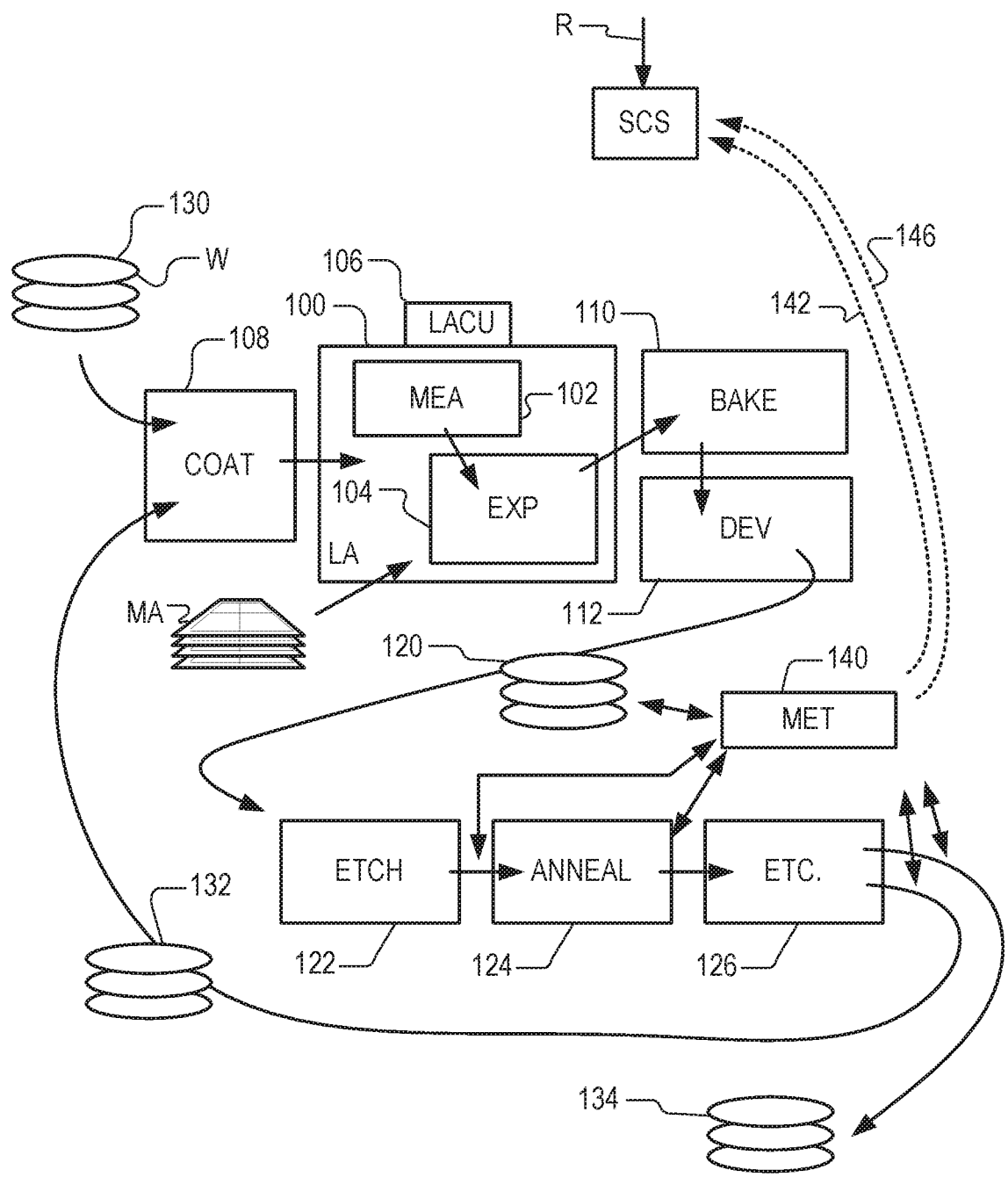
FIG. 1 depicts a lithographic apparatus together with other apparatuses forming a production facility for devices, as an example of a system in which an embodiment of the invention may be used.

FIG. 1 shows a lithographic apparatus LA at 100 as part of an industrial facility implementing a high-volume, lithographic manufacturing process. In the present example, the manufacturing process is adapted for the manufacture of semiconductor products (e.g., integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material on a substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, and/or for other factors such as the use of an immersion liquid or the use of a vacuum. The patterning device MA may be a mask or reticle, which imparts a pattern to a radiation beam transmitted or reflected by the patterning device MA. Well-known modes of operation include a stepping mode and a scanning mode. The projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and patterning devices MA and to implement the patterning operations. Control unit LACU also includes signal processing and data processing capacity to implement desired calculations relevant to the operation of the apparatus. In practice, control unit LACU will be realized as a system of many sub-units, each handling the (real-time) data acquisition, processing and control of a subsystem or component within the lithographic apparatus LA.

In an embodiment, before the pattern is applied to a substrate at the exposure station EXP, the substrate is processed at the measurement station MEA so that various preparatory steps may be carried out. The preparatory steps may include mapping the surface height of the substrate using a level sensor and/or measuring the position of alignment marks on the substrate using an alignment sensor. The alignment marks are arranged nominally in a regular grid pattern. However, due to inaccuracies in creating the marks and also due to deformations of the substrate that occur throughout its processing, the alignment marks may deviate from the ideal grid. Consequently, in addition to measuring position and orientation of the substrate, the alignment sensor in practice must measure in detail the positions of many marks across the substrate area, if the apparatus is to print product features at the correct locations with high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is time-consuming and the provision of two substrate tables enables a substantial increase in the throughput of the apparatus. If the position sensor is not capable of measuring the position of the substrate table while it is at the measurement station as well as at the exposure station, a second position sensor may be provided to enable the positions of the substrate table to be tracked at both stations. Alternatively, the measurement station and exposure station can be combined. For example, it is known to have a single substrate table, to which a measurement stage is temporarily coupled during the pre-exposure measuring phase. The present disclosure is not limited to either type of system.

Within the production facility, apparatus 100, LA forms part of a "litho cell" or "litho cluster" that contains also a coating device 108, COAT configured to apply photosensitive resist and/or other coatings to substrates W for patterning by the apparatus 100. At an output side of apparatus 100, a baking device 110, BAKE and developing device 112, DEV are provided for developing the exposed pattern into a physical resist pattern. Between all of these devices, substrate handling systems take care of supporting the substrates and transferring them from one piece of apparatus/device to the next. These devices, which are often collectively referred to as the "track", may be under the control of a track control unit which is itself controlled by a supervisory control system SCS, which may also control the lithographic apparatus via control unit LACU. Thus, the different devices described above, and devices which may be part of the lithographic apparatus, e.g. the substrate table, can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing devices such as are illustrated at 122, 124, 126. A wide range of processing steps can be implemented by various devices in a typical manufacturing facility. For the sake of example, device 122 in this example is an etching station ETCH, and device 124 is an apparatus ANNEAL that performs a post-etch annealing step. Further physical and/or chemical processing steps are applied in further devices, 126, etc. These specific devices are provided for example only, and other combinations of devices could be used within the scope of the embodiments as are described in further detail below. Additionally, the order in which a substrate is processed by the devices is for example only and the devices may be used in a different order not shown. Numerous types of operation can be carried out by such devices, such as deposition of material, modification of surface material characteristics (oxidation, doping, ion implantation, etc.), chemical-mechanical polishing (CMP), and so forth. The device 126 may, in practice, represent a series of different processing steps performed in one or more devices. These devices may otherwise be referred to as apparatus.

The manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the desired processing, substrates 132 on leaving device 126 may be returned for a subsequent patterning operation in the same litho cluster, they may be destined for patterning operations in a different cluster, or the substrates 134 may be finished products to be sent for dicing and packaging.

Each layer of the product structure typically involves a different set of process steps, and the devices 122, 124 and 126 used at each layer may be completely different in type. Further, even where the processing steps to be applied by the devices 122, 124 and 126 are nominally the same, in a large facility, there may be several supposedly identical machines working in parallel to perform the steps 122, 124 and 126 on different substrates. In other words, there may be several devices of the same type, for example, several etching devices 122, several annealing devices 124 and/or several of each type of further device 126. Small differences in set-up or faults between these machines can mean that devices of the same type influence different substrates in different ways. Even steps that are relatively common to each layer, such as etching (device 122) may be implemented by several etching apparatuses that are nominally identical but working in parallel to maximize throughput. In practice, moreover, different layers typically involve different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in terms of parameters such as resolution and/or overlay may be performed in a more advanced lithography tool than other layers that are less demanding. Therefore some layers may be exposed in an immersion type lithography tool, while others are exposed in a 'dry' tool. Some layers may be exposed in a litho tool working at DUV wavelengths, while others are exposed using EUV wavelength radiation.

In order that the substrates that are exposed by the lithographic apparatus are exposed correctly and consistently, it is desirable to inspect exposed substrates to measure one or more properties such as overlay error between subsequent layers, a line thickness, a critical dimension (CD), etc. Accordingly a manufacturing facility in which litho cell is located also includes a metrology system 140, MET which receives some or all of the substrates W that have been processed in the litho cell. Metrology results are provided directly or indirectly to the supervisory control system (SCS) 138. If an error is detected, one or more adjustments may be made to one or more exposures of one or more subsequent substrates, especially if the metrology can be done soon and fast enough that one or more other substrates of the same lot are still to be exposed. Also, one or more already exposed substrates may be stripped and reworked to improve yield, or discarded, thereby avoiding performing further processing on a substrate known to be faulty. In a case where only one or more target portions of a substrate are faulty, further exposures can be performed only on the one or more target portions which are good.

As shown in FIG. 1, a metrology apparatus 140 can be provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. Additionally or alternatively, the metrology results 142 from the metrology apparatus 140 can be used to maintain accurate performance of the patterning operations in the litho cluster, by supervisory control system SCS and/or control unit LACU 106 making small adjustments over time, thereby reducing or minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

In the example of a lithographic manufacturing process, the substrates are semiconductor wafers or other substrates to which patterns are to be applied in a patterning step, and structures formed by physical and chemical process steps.

Figure 2:
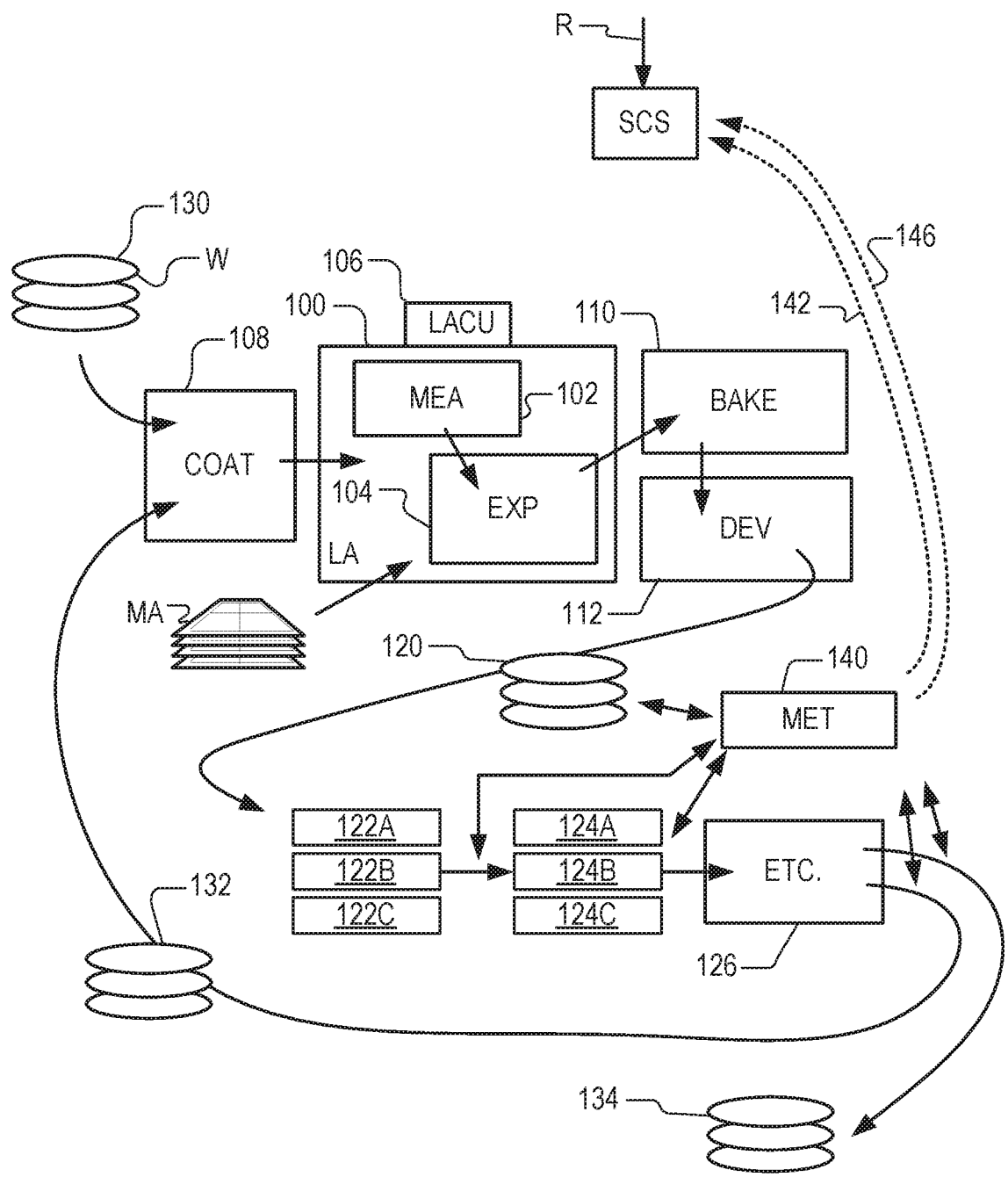
FIG. 2 depicts the lithographic apparatus of FIG. 1 in which a plurality of devices are illustrated by way of example only.

An embodiment of the present invention provides a method for determining a contribution of a device out of a plurality of devices to a fingerprint of a parameter associated with processing of a substrate. Thus, the contribution may be considered as a partial contribution or a relative contribution. This embodiment will be described with respect to the devices shown in FIG. 2. As will be clear from FIG. 2, three etching devices are provided, 122A, 122B and 122C and three annealing devices are provided 124A, 124B and 124C. The substrate 120 having been processed in the lithographic apparatus, is then further processed in an etching step and annealing step. Other steps may also be included, for example a developing step as shown in FIG. 2.

For etching the substrate 120, the substrate 120 may pass through a first etching device 122A, a second etching device 122B or a third etching device 122C. For annealing the substrate 120, the substrate 120 may pass through a first annealing device 124A, a second annealing device 124B or a third annealing device 124C. Each of the different etching devices and annealing devices may have different influences on the fingerprint of the resulting substrate 134. The fingerprint may be a spatial fingerprint, and may be an intra-field and/or inter-field fingerprint, such as a substrate fingerprint, or a field fingerprint, a slit fingerprint or anything time or sequence wise.

As indicated above, the different devices and apparatus used can influence different substrates in different ways. When a substrate has been fully processed, such as substrate 134, even when measurements have been made of the parameters of the substrate, it is not necessarily clear how each of the different devices, e.g. one or more of the different etching devices 122A, 122B or 122C and/or one or more of the different annealing devices 124A, 124B or 124C, have affected the fingerprint of a parameter of the substrate. As described above, even when a plurality of different devices of the same type is used, they can affect a substrate in different ways. It is desirable to produce consistent substrates irrespective of the specific device used. Thus, it is desirable to determine the influence of the different devices on the substrate. It is beneficial to know how a device may affect a parameter on a substrate, for example, for diagnostic reasons or to improve control. This information may be used in different ways, for example to decide when a specific device needs to have alterations made to it or could be used as part of a feedback loop to control the processing of a substrate as is described in further detail below.

So, in an embodiment, there is provided a method for determining a contribution of a device out of a plurality of devices to a fingerprint of a parameter, the parameter being associated with processing of a substrate. This may mean that the parameter is affected or controlled during processing of the substrate, or that the parameter results from the processing. The processing is carried out by the devices and may include various different processes, such as etching and annealing as described below. The method may be used in relation to a fingerprint of various different parameters. The parameter may be any parameter affected or controlled during processing of a substrate. For example, the parameter may be selected from a group comprising critical dimension, overlay, critical dimension uniformity, side-wall angle, line edge placement, alignment, focus (which may otherwise be referred to as levelling), pattern shift, line edge roughness, micro topology, and/or edge placement error (EPE). Additionally or alternatively, the parameter may be selected from a group comprising a shape description of a feature such as side-wall angle, resist height, and/or contact hole ellipticity. Additionally or alternatively, the parameter may be selected from a group comprising a processing parameter such as a coating thickness, optionally bottom anti-reflective coating thickness and/or resist thickness. Additionally or alternatively, the parameter may be selected from a group comprising a processing parameter such as an optical property of a coating, which may optionally indicate a measure of absorption, such as refractive index and or extinction coefficient. Additionally or alternatively, the parameter may be selected from a group comprising a parameter determined from substrate measurements, such as yield parameters, optionally defects and/or electrical performance. The method may be applied to any one of these parameters and could be used on multiple parameters depending on which of the parameters are of most interest or importance to a particular user.

In this embodiment there may be at least two different classes of devices. Only two classes are described, but additional classes may also be provided. The devices in a particular class may be used to carry out similar functions, such as etching or annealing as in the example illustrated in FIG. 2. In other words the devices in a given class are of the same type. For example, as shown in FIG. 2, at least two of the classes have at least two devices. This means that there may be at least two devices of the same type in at least two of the classes. The substrate may only be processed by one device in a first class of devices and/or one device in a second class of devices, e.g. the substrate might be processed by only one of the devices in at least one class, or even only one of the devices in each class.

In the example depicted in FIG. 2, there are several different classes of devices shown. For example, the etching devices 122A, 122B and 122C are each in a first class of device and the annealing devices 124A, 124B and 124C are each in a second class of device. As shown in FIG. 2, there are three etching devices and three annealing devices. Different numbers of classes, different numbers of one or more devices in each class and different combinations of class and numbers in each class may be provided.

As there is a plurality of devices, it is desirable to determine the effect of an individual device. Thus, in an embodiment, the method is for determining a contribution of a single device out of the plurality of the devices. In this way, the impact of a single device can be calculated. As described, the parameter may relate to many things but most generally, the parameter is associated with processing of a substrate. Thus, the parameter is likely affected by processing the substrate and is thus likely to be affected in different ways by the different devices in the plurality of devices.

The method further comprises obtaining parameter data and usage data. The parameter data is based on measurements for multiple substrates having been processed by the plurality of devices. In further detail, the parameter data relates to measurements corresponding to the parameter for substrates processed by the plurality of devices. The usage data indicates which of the devices out of the plurality of devices were used in processing of a substrate. In other words, the usage data indicates which devices have been specifically used for processing each substrate. The usage data thus provides an indication of which individual devices, e.g. which particular device within a class of devices, has been used for processing a substrate. The devices used for processing the substrate can include the devices described above and shown in FIGS. 1 and 2, and include one or more devices within the lithographic apparatus 100 used for processing the substrate, e.g. for example the substrate table used for exposing (in a dual stage lithographic apparatus).

The method further comprises determining the contribution using the usage data and parameter data. Thus, the method determines the contribution from one of the devices out of the plurality of devices to a fingerprint of a parameter associated with processing the substrate by using the above described data. This can be done in a variety of different ways.

In an embodiment, the method may further comprise using a matrix to determine the contribution. The matrix may refer to an array of quantities or expressions in rows or columns. The matrix may be part of a matrix equation which may be solved to determine unknown values in the equation. The method may comprise a step of determining a matrix using the usage data. The step of determining the contribution may comprise solving an equation comprising the matrix and using the parameter data. The matrix may represent the devices used to process multiple substrates. Thus the matrix may be used to define a relationship between the contribution of a device to a fingerprint of a parameter and the parameter data. This embodiment may be used with any matrix solution method or variation thereof. As will be described in the examples below, the matrix equation may be solved to determine the contribution of a device out of a plurality of devices by multiplying a transformed version of the matrix with the parameter data, optionally wherein the transformed version of the matrix is the inverse of the matrix.

Determining the matrix may be done in a variety of different ways. Generally, in an embodiment, each row of the matrix represents a substrate having been processed by at least one device in a first class of devices and at least one device in a second class of devices. Thus, each row represents a substrate having been at least partially processed. This means that each substrate which provides measurements being used to determine the impact of the devices has a single corresponding row in the matrix. This may correspond to the substrate having passed through at least one of the first class of devices and at least one of the second class of devices. In the example of FIG. 2, the first class of devices are the etching devices 122A, 122B and the second class of devices are the annealing devices 124A, 124B. Each column in the matrix may represent one device of the plurality of devices. The substrate may only be processed by one device in any particular class, e.g. one device in the first class of devices and/or one device in the second class of devices.

As the substrate is processed, it will pass through different types of device, i.e. devices in different classes. Thus, the substrate may pass through at least one device in a variety of classes. The substrate may pass through at least one device in each of the classes. For each substrate, data can be collected and/or obtained to indicate which devices have been used to process that substrate. As described, this is the usage data. The usage data can be used to generate the matrix. The row of the matrix has a non-zero entry corresponding to each of the devices used to process that particular substrate. In other words, for each substrate, there is an entry in the matrix indicating which particular device from the plurality of devices has been used in processing that substrate. The entry may be a value, such as 1, or may be a sub-design matrix (which will be described in further detail below). In an example, the model may be solved for individual measurement locations, wherein the model per location is:

$$x_i = b_{etchA,i} + b_{anneal B,i} \quad (1)$$

where i indicates the measurement number, i.e. indicates which substrate the measurement relates to. In this example, the parameter data x is based on at least one measurement from a substrate that has been processed by an etching device and an annealing device. A and B can indicate any of a particular etching and annealing device respectively. For example, A may be replaced with 1, and etch1 may correspond to the first etching device 122A in FIG. 2, and B may be replaced with 2, and anneal2 may correspond to the second annealing device 124B in FIG. 2. The symbols are not in bold because the parameters (e.g. the b's) are single values, and can be interpreted as decomposed measurements. All decomposed measurements may be fitted with a fingerprint model, if desired.

For individual measurement locations for multiple substrates, the multiple substrates may each be processed by at least one device. To solve equation (1), multiple equations are provided for different substrates, i.e. having different values of i. A matrix can be formulated based on the model for the multiple substrates and equation (1) can apply to each substrate. The parameter data based on measurements for each substrate at a particular location can be written as a vector, wherein $x=[x_1, x_2, x_3 \ldots x_n]$. Equations which are equivalent to equation (1) for each substrate can be combined as a matrix formulation. The matrix formulation of a linear model for estimating the fingerprint of a parameter can be represented as:

$$x = M \cdot b \quad (2)$$

wherein the symbols are in bold because they refer to vectors and a matrix. In this example, x is a vector based on measurements for multiple substrates having been processed by the plurality of devices, i.e. x is the parameter data, b is a vector of parameters of the linear model, and M is a matrix. A substrate is represented by a row of matrix, M, so the number of rows of the matrix, M, is the same as the size of the vector x. Each column may contain a basis function for one parameter in b, evaluated for all measurements, and each row may contains all basis functions evaluated based on measurements for one substrate.

In an example, six substrates (e.g. $x_1, x_2, x_3, x_4, x_5, x_6$) are processed by a first etching device 122A, a second etching device 122B or a third etching device 122C, and a first annealing device 124A, a second annealing device 124B or a third annealing device 124C as shown in FIG. 2. The first substrate is processed using the first etching device 122A and the first annealing device 124A. The second substrate is processed using the second etching device 122A and the second annealing device 124B. The third substrate is processed using the first etching device 122A and the third annealing device 124C. The fourth substrate is processed using the third etching device 122C and the first annealing device 124A. The fifth substrate is processed using the second etching device 122B and the third annealing device 124C. The sixth substrate is processed using the third etching device 122C and the second annealing device 124B.

Each substrate has an equation corresponding to equation (1), and the combinations from the devices used for the different substrates can be applied in a matrix formulation as in equation (2). Thus, the matrix formulation of equation (2) may be written out in full for this example as follows:

$$\begin{pmatrix} x_1 \\ x_2 \\ x_3 \\ x_4 \\ x_5 \\ x_6 \end{pmatrix} = \begin{pmatrix} 1 & 0 & 0 & 1 & 0 & 0 \\ 0 & 1 & 0 & 0 & 1 & 0 \\ 1 & 0 & 0 & 0 & 0 & 1 \\ 0 & 0 & 1 & 1 & 0 & 0 \\ 0 & 1 & 0 & 0 & 0 & 1 \\ 0 & 0 & 1 & 0 & 1 & 0 \end{pmatrix} \cdot \begin{pmatrix} b_{etch1} \\ b_{etch2} \\ b_{etch3} \\ b_{anneal1} \\ b_{anneal2} \\ b_{anneal3} \end{pmatrix} \quad (3)$$

As described, each row of matrix, M, indicates a substrate and each column represents one of the devices. Thus, in this example, the matrix, M, may be generated to represent the first substrate in a first row, the second substrate in a second row and the third substrate in the third row, and so on. Furthermore, the first column may correlate to the first etching device 122A, the second column may relate to the second etching device 122B, the third column may relate to the third etching device 122C, the fourth column may relate to the first annealing device 124A, the fifth column may relate to the second annealing device 124B and the sixth column may relate to the third annealing device 124C.

The first substrate should have non-zero entries corresponding to the first etching device 122A and the first annealing device 124A. Thus, the first substrate (in the first row) has a non-zero entry in the first column and fourth columns of the matrix, M. As the first substrate was not processed by the second etching device 122B, third etching device 122C, the second annealing device 124B or the third annealing device 124C, the first row has zero entries in the second, third, fifth and sixth columns.

The second substrate should have non-zero entries corresponding to the second etching device 122B and the second annealing device 124B. Thus, the second substrate (in the second row) has a non-zero entry in the second and fifth columns of the matrix, M. As the second substrate was not processed by the first etching device 122A, third etching device 12C, the first annealing device 124A or the third annealing device 124C, the second row has zero entries in the first, third, fourth and sixth columns.

The third substrate should have a non-zero entry corresponding to the first etching device 122A and the third annealing device 124C. Thus, the third substrate (in the third row) has a non-zero entry in the first and sixth columns of the matrix, M. As the third substrate was not processed by the second etching device 122B, the third etching device 122C, the first annealing device 124A or the second annealing device 124B, the first row has zero entries in the second, third, fourth and fifth columns.

The entries in the matrix for the fourth, fifth and sixth substrates are determined in the same way. In this way, the usage data can be used to generate a matrix, M. The matrix, M, clearly indicates which of the plurality of devices have been used for processing a substrate. Thus a matrix, M, is determined as shown below which corresponds to the matrix in equation (3):

$$M = \begin{pmatrix} 1 & 0 & 0 & 1 & 0 & 0 \\ 0 & 1 & 0 & 0 & 1 & 0 \\ 1 & 0 & 0 & 0 & 0 & 1 \\ 0 & 0 & 1 & 1 & 0 & 0 \\ 0 & 1 & 0 & 0 & 0 & 1 \\ 0 & 0 & 1 & 0 & 1 & 0 \end{pmatrix} \quad (4)$$

The same equations as above may be applied for more complicated models, such as when the parameter data is based on measurements which are preprocessed. In an example, the model of contributions from different devices can be written as follows:

$$x = M_A \cdot b_A + M_B \cdot b_B \quad (5)$$

wherein A and B are labels of a first and second device. The model can be different for the devices A and B, and can have different numbers of parameters, which would lead to different sizes of the vectors b, and different number of columns of the matrices, M. As before, x is also a vector. This example corresponds to the equation (1) but using sub-design matrices.

Solving equation (5) requires more than one set of measurements. Thus, the parameter data is based on measurement for multiple substrates, which as shown in equation (6) may be a first and second substrate:

$$\begin{cases} x_1 = M_{A,1} \cdot b_A + M_{B,1} \cdot b_B \\ x_2 = M_{A,2} \cdot b_A + M_{B,2} \cdot b_B \end{cases} \quad (6)$$

wherein the numerical subscripts indicate the substrate which has been processed, and A and B are labels of the devices used to process that substrate, as in equation (5). Each equation in (6) may relate to a model/fingerprint for one substrate, i.e. relating to multiple locations on a single substrate.

Equation (6) can be rewritten as:

$$\begin{pmatrix} x_1 \\ x_2 \end{pmatrix} = \begin{pmatrix} M_{A,1} & M_{B,1} \\ M_{A,2} & M_{B,2} \end{pmatrix} \cdot \begin{pmatrix} b_A \\ b_B \end{pmatrix} \quad (7)$$

which shows how the design matrix may be composed of multiple sub-design matrices, e.g. $M_{A,1}, M_{A,2} \ldots$ etc. Each sub-design matrix may be generally written as $M_{X,i}$, where i indicates the substrate and X indicates the device use on the substrate. The sub-design matrix, $M_{X,i}$ is a matrix within the design matrix, M. This mechanism of combining two linear models can be extended to include more contributor models for additional substrates and/or devices. The sub-design matrix may be a zero entry sub-design matrix or a non-zero entry sub-design matrix. A zero entry sub-design matrix may correspond to the devices out of the plurality of devices not used to process the substrate. The zero entry sub-design matrix may be a matrix comprising only 0 entries. The sub-design matrices in a single matrix may all be the same size, such that the zero-entry sub-design matrix and the non zero-entry sub-design matrix are the same size. A non-zero entry sub-design matrix may correspond to each of the devices used to process the substrate. The non-zero entry sub-design matrix may be based on a modelled contribution to the fingerprint from the respective device and substrate. In other words, the non zero-entry sub-design matrix may include information modelling the contribution on a particular substrate from a particular device. The zero entry sub-design matrices may be used in place of the zero entries in the matrix described above and the non zero-entry sub-design matrices may be used in place of the non zero entries in the matrix described above.

In the present example, for every substrate, a model with one term for each class of devices used on that substrate is created, for example:

$$\begin{pmatrix} x_1 \\ x_2 \\ x_3 \\ x_4 \end{pmatrix} = \begin{pmatrix} M_{etch1,1} & 0 & M_{anneal1,1} & 0 \\ 0 & M_{etch2,2} & 0 & M_{anneal2,2} \\ M_{etch1,3} & 0 & 0 & M_{anneal2,3} \\ 0 & M_{etch2,4} & M_{anneal1,4} & 0 \end{pmatrix} \cdot \begin{pmatrix} b_{etch1} \\ b_{etch2} \\ b_{anneal1} \\ b_{anneal2} \end{pmatrix} \quad (8)$$

In this example, etch indicates a first class of devices, i.e. etching devices, and anneal indicates a second class of devices, i.e. annealing devices. The 0 matrices have dimensions which correspond to the matrices, $M_{X,i}$.

Each of the plurality of devices may be used to process at least one of the multiple substrates. In other words, to solve the equation comprising the matrix to determine the contribution from a device out of a plurality of the devices, the device must have been used on at least one of the substrates in the matrix. The fewer combinations of devices there are, the greater the uncertainty in the resulting determination.

Although the etching and annealing devices are used as examples described above, any different type of device (as well as any numbers of devices in one type and any number of different types of device) may be used. The device may be any device which impacts a parameter described above. Thus the different types of device could include etching devices, deposition tools, substrate tables, polishing devices (such as chemical-mechanical planarization devices), annealing devices (such as rapid thermal annealing devices), cleaning devices, coating devices (such as those used to apply a resist), developing devices, track devices, implantation devices and/or baking devices. As would be understood, any combination of devices may be applicable and may be used on the substrate. Determining the contribution may increase in complexity as the number of devices increases but would still be possible using the matrix method described.

The parameter data may relate to the measurements in different ways (the measurements may otherwise be referred to as measurement data). In an example, the parameter may be the same as the measurements. In other words, no pre-processing of the measurements may be carried out and the contribution may be determined using the parameter data without initial processing. Alternatively the measurements could be processed using a variety of different methods to provide the parameter data. In other words, the parameter data is based on processed measurements. For example, the measurements can be processed using principal component analysis or fitting a model to the measurements (such as a polynomial model or a linear model, e.g. using Zernike analysis). Using Zernike analysis may use sub-design matrices as described above. Principal component analysis (e.g. using statistical or spatial correlation) may have an advantage of filtering noise. Statistical correlation may be used which may only be based on major fingerprints which suppresses differences that are small or not correlating between substrates. The parameter data which is based on processed measurements may result in sub-design matrices as described in relation to equations (5) to (8).

Different types of fit may be used and they may be effective for suppressing noise. Thus, the parameter data may be a model based on measurement for the substrates having been processed by the plurality of devices. This may decrease the number of measurements needed while still providing usable parameter data with accuracy to a desired degree.

The equation comprising the matrix may be solved using a variety of different methods. Most generally, the matrix equation can be solved by multiplying a transformed version of the matrix with the parameter data. For example, equation (2) above can be solved using standard linear algebra techniques, e.g. the equation comprising the matrix can be solved using a least squares fit:

$$b = (M'\cdot M)^{-1} \cdot M'x \quad (9)$$

and a similar method may be applied to equation (7). An advantage of using a least squares fit is that this may be quicker than other methods and it can be solved without explicit matrix inversion, using e.g. Penrose pseudo-inverse, or QR decomposition. Additionally, the above equations, e.g. equations (2) and/or (7), may be adapted to include an indication of noise variance such that noise variance has a reduced effect. However, it won't work on an undetermined system and there may be overfitting. In case the M'M matrix is almost singular, alternative techniques exist to make the problem more easily solvable, e.g. singular value decomposition (SVD).

Singular value decomposition may be used based on the following theorem in which:

$$M = U_{m \times m} S_{m \times k} V_{k \times n} \quad (10)$$

where U and V are each unitary matrices, $U^T U = I_{n \times n}$ and $V^T V = I_{p \times p}$ (i.e. U and V are orthogonal), and S is a diagonal matrix. The subscript m and n values represent the number of rows and columns of each matrix respectively, i.e. U is an m by m matrix and S is an m by k matrix. This can be applied to the above equations such that:

$$X_{m \times p} = U_{m \times m} S_{m \times k} V_{k \times n} b_{n \times p} \quad (11)$$

This equation can be solved to provide the following solution:

$$b = V_k (S_k^T S_k)^{-1} S_k^T U^T x \quad (12)$$

Part of the problem is that the matrix is likely to be overdetermined, meaning that there is not necessarily one simple solution. This means that inverting the matrix often won't work. For any solution, an infinite number of alternative solutions may be created by adding an arbitrary number or vector to all b or b of one group, while simultaneously subtracting the same number of vector from the b or b of another group.

One useful way to overcome this is to make the average contribution of a class of devices zero, and the average fingerprint is in a new b or b.

Referring to the above equations, this means that an additional $b_{global}$ is added to the model and there will be the following two additional constraints which can be handled during solving the model:

$$b_{etch1} + b_{etch2} = 0 \quad (13)$$

$$b_{anneal1} + b_{anneal2} = 0 \quad (14)$$

This example of including additional constraints is based on adapting equation (8) described above.

Alternatively, the additional constraints may be made explicit in the matrix, by removing one of the columns of each group, and adding −1 in the remaining columns of that group, in case the measurement or substrate has the removed contributor label. In addition, the removed contributors' b or b are also removed. In the next example, based on equation (3), the last contributor of each group is removed:

$$\begin{pmatrix} x_1 \\ x_2 \\ x_3 \\ x_4 \\ x_5 \\ x_6 \end{pmatrix} = \begin{pmatrix} 1 & 1 & 0 & 1 & 0 \\ 1 & 0 & 1 & 0 & 1 \\ 1 & 1 & 0 & -1 & -1 \\ 1 & -1 & -1 & 1 & 0 \\ 1 & 0 & 1 & -1 & -1 \\ 1 & -1 & -1 & 0 & 1 \end{pmatrix} \cdot \begin{pmatrix} b_{global} \\ b_{etch1} \\ b_{etch2} \\ b_{anneal1} \\ b_{anneal2} \end{pmatrix} \quad (15)$$

After the system is solved, $b_{etch3}$ may be calculated as $-(b_{etch1} + b_{etch2})$; likewise, $b_{anneal3}$ is $-(b_{anneal1} + b_{anneal2})$.

The equation comprising the matrix can also be solved using a least squares fit based on regularization. Optionally, an L-curve method and/or leave-one-out cross validation method may be used. Regularization techniques may be used to prevent overfitting. These methods may be beneficial in suppressing randomness, which might include measurement noise and/or other contributors. Use of an L-curve method is described in "The L-curve and its use in numerical treatment of inverse problems" by P. C. Hansen in Computational Inverse Problems in Electrocardiology, ed. P. Johnston, Advances in Computational Bioengineering (https://www.sintef.no/globalassets/project/evitameeting/2005/1curve.pdf), which is hereby incorporated by reference in its entirety. Regularization generally limits the range of fitted parameters, e.g. reducing high frequencies, and it still allows use of the full model, e.g. the mixing model, but implicitly suppresses noise in the measurements. For example, regularization techniques, such as ridge regression, can be used to reduce or minimize fit error. Such techniques may be used based on the following equation:

$$b = (M^T M + \lambda I)^{-1} M^T x \quad (16)$$

In brief, for a set of lambdas (λ), the procedure comprises a step of leaving out one substrate for all combinations (so substrates 1-19, substrates 1-18+20, etc.) and solving the model in equation (16) with a particular lambda. Further steps include calculating the fit error on the left-out substrate, calculating the average fit error, plotting the average fit error against lambda and choosing a lambda with the smallest fit error. The equation comprising the matrix can also be solved using Bayesian statistics which has advantages of avoiding overfitting, prior knowledge can be systematically incorporated and a distribution of the result can be provided rather than a single point. However, heavy computational processing may be required and there may be large memory requirements.

In the case of multidimensional measurements (e.g. overlay), the above methods can be applied separately on x and y.

In the above example, an entry in the matrix may simply be 1 (as the non-zero entry) or a zero indicating the specific device used to process a particular substrate. However, the matrix may comprise at least one sub-design matrix as shown in equations (5)-(8). In other words, an entry in the matrix may comprise a further matrix. For example, the simpler matrix may be used when the parameter is determined at an individual location and the matrix may be more complex, for example by using sub-design matrices when processing multiple locations. The content of the sub-design matrix content can vary, for example different sub-design matrices may be used for different classes, e.g. an offset/curvature for one class of devices and global for another class of devices.

In the above described one or more embodiments, a matrix can be determined and then used to determine the contribution of a device, out of a plurality of devices, to a fingerprint of a parameter. As described, there are several ways in which the matrix can be determined. The above-described method seeks to find incorrect disturbance sources which negatively impact on parameters of printed substrates W. Measurements of the substrate W can be decomposed based on context data to work out the contribution of a specific device. In this way, the method can be used to determine what affects a parameter of a printed substrate with relatively good accuracy. In this way, negative contributions to a parameter from a specific device can be accounted for, i.e. minimized and/or corrected.

A sufficiently information-rich data set may be used to properly decompose the fingerprint of a parameter to determine the contribution of a particular device. This may mean that a relatively large set of data is needed, which can be costly. In other words, a possible issue is that a large number of substrates W may need to be processed in a variety of different ways and then measured in order to determine the specific fingerprint for any one device. Additionally, there may be a relatively large amount of redundant data in the data set. In order to get the desired data set, sampling periodically/randomly, etc. could be used to reduce the number of substrates which need to be processed and measured. However, a better data set could be provided by using a more focused method as described below. The method might indicate where measurements should be carried out and on how many substrates W. Thus, the method may comprise steps to improve or optimize the determination of the matrix so that fewer substrates W are used to determine the contribution of the different devices.

In further detail, the matrix can be determined in a specific way to provide advice about which substrates W should be measured and/or which devices should be used to process substrates to measure a useful number of substrates in the shortest amount of time and/or to advise how to extend a data set with a reduced or minimal number of substrates, as an addendum to a data set already gathered, e.g. by determining which devices to use to process selected additional substrates.

Generally, the method for determining the matrix is for selecting a thread of process steps applied to multiple substrates. This means that the matrix may be used to select which combination of devices should be used to process individual substrates in a selected group of substrates. The method comprises selecting a first thread (e.g. a first combination of devices for processing a substrate) which may correspond to a row in the matrix. The method may further comprise selecting at least one further thread (e.g. at least one further combination of devices for processing at least one further substrate) based on an expected improvement with which a characteristic of a process step associated with the first thread and the second thread can be determined.

In further detail, the method for determining the matrix as described herein may further comprise the following steps, which are desirably provided in the following order:

a. generating a first matrix, N, representing the possible combinations of the plurality of devices used to process a substrate W;

b. determining a vector, $n_i$, for each row, i, of the first matrix, N;

c. calculating a delta covariance matrix, $\Delta Y_i$ for each row, wherein the delta covariance matrix is $n_i^T n_i$;

d. selecting a row, i, from the first matrix, N, and storing the selected row as a second matrix, M;

e. determining if a stopping criteria has been met, wherein:

if the stopping criteria is not met, continuing with step f using an updated first matrix, N, in which the selected row is removed; and if the stopping criteria is met, using the second matrix, M, as the determined matrix;

f. calculating the pseudo-determinant corresponding to each remaining row of the updated first matrix, N;

g. determining a row with a preferred pseudo-determinant, updating the second matrix, M, to include the row with the preferred pseudo-determinant, and updating the first matrix, N, by removing the row with the preferred pseudo-determinant;

h. determining if a stopping criteria has been met, wherein:

if the stopping criteria is not met, returning to step f using an updated first matrix, N, in which the row with the preferred pseudo-determinant is removed; and if the stopping criteria is met, the updated second matrix, M, is used as the determined matrix.

Determining the matrix in this way means that it might be possible to determine how the parameters of a printed substrate W have been affected while using a low or minimal number of test substrates. This method provides a sampling scheme optimization which allows selection of metrology targets to generate informative measurements with low or minimal metrology load. Therefore, using this method means that the metrology load (i.e. the number of substrates to be measured) can be reduced while still providing a matrix which is beneficial to the user.

The above described method provides guidance about which substrates, having been processed by specific devices, to measure based on the contents of the second matrix, M. This is beneficial in that it reduces or minimizes measurement effort while enabling good accuracy in the estimated contribution. This provides a cost-effective alternative to measuring additional substrates.

In the present method, substrates W can be processed according to an optimal, possibly limited, combination of threads (i.e. a specific combination of devices for processing individual substrates) which means that only measurements from these substrates can be used. This selection of the most informative threads yields accurate context specific fingerprint determination. The covariance analysis techniques used in the above described steps do not generally require a large amount of computational processing to execute. Furthermore, this method is advantageous in that if a large number of substrates W have been processed for a large number of threads, the method may be used to guide which performance parameter measurements should be carried out to determine context specific fingerprint information.

It should be noted that the first matrix, N, uses usage data indicating which of the devices out of the plurality of the devices were used in the processing of each substrate. Thus, the first matrix, N, may represent all the possible combinations of the plurality of devices used to process a substrate.

The first matrix N may otherwise be referred to as a context mixing matrix, i.e. a matrix holding all possible context paths a substrate can traverse, i.e. all the different possible combinations of devices which may be used to process a substrate. The vector $n_1$ for the ith row vector may otherwise be referred to as the ith row vector. When the first row is added to the second matrix, M, this may be referred to as initializing a sampling scheme, wherein a sample of the first matrix, N, is used to form the second matrix, M.

The size of the delta covariance matrix, $\Delta Y_i$ for each row may be based on the size of the first matrix, N. If the matrix N is of dimension n_a by n_b, then $\Delta Y_i$ is of size n_b by n_b, i.e. a square matrix with the same number of rows and columns. As described, n_b may be the amount of devices, whereas n_a may indicate the plurality of combinations of devices.

When the rows are selected from the first matrix, N, and stored in the second matrix, M, the new rows may be appended to the second matrix, M, at the bottom of the second matrix, M. Thus, in this way, the rows can be transferred from the first matrix, N, to the second matrix, M, and the rows being added to the second matrix, M, can be added in an ordered way. This is advantageous because if the second matrix, M, needs to be truncated at a later date, for example if a user needs to further limit the number of substrates tested, then the second matrix, M, can be reduced while maintaining optimum rows at the top of the second matrix, M. Additionally, if the rows are added to the second matrix, M, in an ordered way, then this may allow a user to more easily evaluate the preferred size of the experiment. For example, a certain parameter of interest may be compared to the number of substrates/different combination of processing devices used on the substrates. For example, the parameter may be plotted on a function of the "size" of the experiment. This could be used to check how many rows of M are needed to pass a certain threshold, i.e. meet a stopping criteria. Then this denotes the "size" of the experiment (e.g. the number of substrates to be sampled).

The method described above essentially uses steps f to h to probe each of the rows remaining in the first matrix, N, to determine which of the rows is the most valuable. The most valuable row is then added to a further matrix. The further matrix is the second matrix, M. In other words, the second matrix, M, can be used in the linear equation in the one or more embodiments described above. The second matrix, M, can be later used to determine the contribution of a device out of a plurality of devices. When a row is removed from the first matrix, N, the process is repeated and the remaining rows are then probed to determine which of the remaining rows is the most valuable. The next most valuable row is then added to the second matrix, M. In this way, the most valuable rows of the first matrix, N, can be added to the second matrix, M, until a stopping criteria is met. The stopping criteria can be selected or predetermined depending on a variety of different options as described below.

As described above, the pseudo-determinant for each row is calculated to determine the row with the preferred pseudo-determinant. The pseudo-determinant is calculated by adding the delta covariance matrix, $\Delta Y_i$, for each row to a third matrix, Y, wherein the third matrix, Y, is the covariance of the second matrix, M. Further to this, the determinant of the sum of the third matrix, Y, and the delta covariance matrix for the row, $\Delta Y_i$ can then be calculated. Thus, the determinant of $Y+\Delta Y_i$ is calculated. In every iteration, i.e. for each row i out of the first matrix, N, the pseudo determinant of $Y-\Delta Y_i$ is evaluated. This equates to the sum of the covariance of the current second matrix, M, and $\Delta Y_i$ (for row i of the first matrix, N). This calculation is carried out for all rows i of the first matrix, N. The third matrix, Y, is kept track of, and represents the covariance of the second matrix, M. Thus, whenever the second matrix, M, is updated, the third matrix, Y, is also updated accordingly.

A row of the first matrix, N, may represent a possible combination of the plurality of devices used to process a substrate. A column of the first matrix, N, may represent one of the plurality of devices. In this case, a row of the first matrix, N, may have a non-zero entry corresponding to each of the plurality of devices used to process the substrate represented by that respective row. Similarly, the first matrix, N, may have a zero entry corresponding to each of the plurality of devices not used to process the substrate represented by that respective row.

It is described above that the preferred pseudo-determinant is determined and then included in this second matrix, M. The preferred pseudo-determinant may otherwise be referred to as the optimum pseudo-determinant. The preferred pseudo determinant may be considered to be the pseudo-determinant with the highest value. In other words, the row n out of the first matrix, N, which attained the highest pseudo determinant may added to the second matrix, M. One or more other means may be used. For example, the trace of $inv(Y+\Delta Y_i)$ could be used (the trace is the sum over the diagonal elements). In this case, the row with the minimum value of the trace may have the preferred pseudo-determinant. Alternatively, a value of v_j could be minimized with $v\_j=sqrt(x\_j*inv(Y+\Delta Y_j)*x\_j')$, with x_j being the j_th row out of the combined [M;N] matrix. In this case, the row with the maximum value of v_j may have the preferred pseudo-determinant.

After the delta covariance matrix for each row is calculated, a row is selected (as the first selected row) from the first matrix, N. The row that is first selected may be the first row of the first matrix, N. This is not necessary, however, it simplifies the process in that the first selected row is simply the first row of the first matrix, N.

As described above, the process for determining the matrix may be stopped if a stopping criteria is met. The stopping criteria could be based on one or more of a variety of different selected criteria. The stopping criteria may otherwise be referred to as a key performance indicator. The stopping criteria may have a predetermined or selected value. Although, this value may be altered, for example, depending on the selection of a user.

For example, the stopping criteria may be met if the number of rows used in the second matrix, M, reaches a predetermined value. Additionally or alternatively, the stopping criteria may be met if all rows of the first matrix, N, are used in the second matrix, M. Additionally or alternatively, the stopping criteria may be met if a value of a performance parameter reaches a predetermined value. The performance parameter may be any parameter relating to the substrate. For example, the performance parameter may be one or more selected from: i. critical dimension, overlay, critical dimension uniformity, line edge placement, alignment, focus, pattern shift, line edge roughness, micro topology, and/or edge placement error; and/or ii. a shape description of a feature, such as side-wall angle, resist height, and/or contact hole ellipticity; and/or iii. a processing parameter such as a coating thickness such as bottom anti-reflective coating thickness and/or resist thickness, and/or an optical property of a coating which may indicate a measure of absorption, such as refractive index and/or extinction coefficient; and/or iv. a parameter determined from substrate measurements, such as a yield parameter, such as defects and/or electrical performance. It will be understood that a user may select other stopping criteria which may be used in addition or as an alternative to the stopping criteria described here.

When all the rows of the first matrix N are used, the rows may still be effectively sorted in the second matrix, M, by relevance because the most or more optimal rows may be provided towards the top of the second matrix, M. Thus, the list of rows in the second matrix, M, could be later truncated to a reduced size. In other words, when all of the rows of the first matrix, N are used in the second matrix, M, the resulting matrix could be later truncated resulting in the same effect as other stopping criterion, such as a predetermined data set.

The above steps of the method include various determining, calculating and selecting steps. It will be understood that the data used during and after each of these steps may be stored in an appropriate data storage medium (e.g., semiconductor memory, magnetic or optical disk).

In a further embodiment, the contribution is determined without requiring the use of a matrix (although a matrix equation may optionally be used). This embodiment is essentially the same as the earlier embodiments except for the use of the matrix. This embodiment may comprise the step of analyzing variation of the parameter data using the usage data, i.e. carrying out "Analysis of Variation" (ANOVA) on the measurement data. In this embodiment, the general idea is to evaluate the variation between the measurement data when grouping the measurement data according to the usage data. Thus, this method comprises determining the contribution to the parameter for each device by grouping the measurement data using the analyzed variation. In addition the contribution to a fingerprint from the various parameters can be assessed using a fingerprint model. This is done most efficiently with a model of the fingerprint based upon principal component analysis coefficients (also called loading) of the data.

For determining a contribution of a device to a fingerprint of a parameter, the method may comprise using the ANOVA procedure (e.g. Matlab "anovan") per measurement location, and retrieving for each class of device the difference between the mean of the group measurements per device and the global mean, and taking that as the decomposed measurements. All decomposed measurements may then be fitted with a fingerprint model, if desired.

The methods of the embodiments herein may be used to control a device. At least one of the devices may be controlled based on the determined contribution to the fingerprint of the parameter of that device. Thus, the determined contribution for a device may be used to alter the way in which the processing of a substrate is carried out by that device. In other words, any error or variation in fingerprint which is undesirably induced by a specific device may be reduced or eliminated by controlling the device based on its determined parameter contribution. Additionally or alternatively, other devices including a litho tool 100 may be controlled based on the determined parameter contribution. As described, the parameter may be many different things. The parameter may be any parameter that directly or indirectly influences the control applied by a device.

It is described above that a row of the matrix may represent a substrate, and in particular, a substrate having been processed by at least one device in a first class of devices and at least one device in a second class of devices, and a column represents one of the plurality of devices. However, it will be understood that the rows and columns may be switched. Thus, a row of the matrix may represent one of the plurality of devices and a column may represent a substrate. In other words, the matrix described above may be transposed.

Generally, the methods described above are used for at least two classes, and at least two devices in at least two classes because this makes the matrix overdetermined. Theoretically, at least one class may have only one device, and this would still be useful for determining the effect of the plurality of devices. At least one class may comprise more than two different devices, as shown in the examples described above in relation to equations (7) and (8). Theoretically, there may only be one class of devices and multiple devices within that class. In this case, it would still be useful, e.g. to obtain an average fingerprint based on these devices. Alternatively, although the description refers to a first class and a second class, there may be more than two different classes. The classes may include the types of classes described above, a combination of at least one of the described classes with at least one additional class, or different classes may be provided. There may be different numbers of classes and different numbers of devices in each class.

In an embodiment, a system is provided comprising a processor configured to determine a contribution from a device out of a plurality of devices to a fingerprint of a parameter, the parameter being associated with processing of a substrate. The processor is configured to carry out the method according to any of the embodiments herein. The processor may be part of, or connected to, either the automated process control (APC) system and/or the supervisory control system.

The processor may be configured to determine a contribution from a device out of a plurality of devices to a fingerprint of a parameter, the parameter being associated with processing of a substrate, the processor being configured to: obtain parameter data and usage data, wherein the parameter data is based on measurements for multiple substrates having been processed by the plurality of devices, and the usage data indicates the devices used in the processing of each substrate; and determine the contribution using the usage data and the parameter data.

In an embodiment, a computer program is provided containing one or more sequences of machine-readable instructions describing a method of determining a contribution from a device out of a plurality of devices to a fingerprint of a parameter, the parameter being associated with processing of a substrate. Any of the methods herein may be implemented using a computer program containing one or more sequences of machine-readable instructions. There may also be provided a data storage medium (e.g., semiconductor memory, magnetic or optical disk) having such a computer program stored therein.

A program is provided for controlling determining a contribution from a device out of a plurality of devices to a fingerprint of a parameter, the parameter being associated with processing of a substrate. The program may comprise instructions for carrying out a method comprising: obtaining parameter data and usage data, wherein the parameter data is based on measurements for multiple substrates having been processed by the plurality of devices, and the usage data indicates which of the devices out of the plurality of devices were used in the processing of each substrate; and determining the contribution using the usage data and the parameter data. The program may comprise instructions for carrying out the steps of any of the methods described herein.

The computer program may be executed for example within the control unit LACU of FIG. 1, or some other controller, for example within a metrology system that includes the metrology apparatus 140, or in an advanced process control system or separate advisory tool. The program may optionally be stored in a memory which is part of, or can be accessed by, the automated process control (APC) system and/or the supervisory control system.

Further embodiments of the disclosure are disclosed in the list of numbered embodiments below:

1. A method of determining a contribution of a device out of a plurality of devices to a fingerprint of a parameter, the parameter being associated with processing of a substrate, the method comprising:

obtaining parameter data and usage data, wherein the parameter data is based on measurements for multiple substrates having been processed by the plurality of devices, and the usage data indicates which of the devices out of the plurality of the devices were used in the processing of each substrate; and determining the contribution using the usage data and parameter data.

2. The method of embodiment 1, further comprising determining a matrix using the usage data and wherein determining the contribution to the fingerprint comprises solving an equation comprising the matrix using the parameter data.

3. The method of embodiment 2, wherein the matrix equation is solved to determine the contribution of a device out of a plurality of devices by multiplying a transformed version of the matrix with the parameter data, wherein optionally the transformed version of the matrix is the inverse of the matrix.

4. The method of embodiment 2 or embodiment 3, wherein a row of the matrix represents a substrate having been processed by at least one device in a first class of devices and at least one device in a second class of devices, and the column of the matrix represents one of the plurality of devices.

5. The method of any of embodiments 2 to 4, wherein a row of the matrix has a non-zero entry corresponding to each of the devices used to process the substrate represented by that respective row, and a zero entry for the devices out of the plurality of devices not used to process the substrate represented by that respective row.

6. The method of embodiment 2 or embodiment 3, wherein a column of the matrix represents a substrate having been processed by at least one device in a first class of devices and at least one device in a second class of devices, and a row of the matrix represents one of the plurality of devices.

7. The method of embodiment 2, embodiment 3 or embodiment 6, wherein a column of the matrix has a non-zero entry corresponding to each of the devices used to process the substrate represented by that respective row or column, and a zero entry for the devices out of the plurality of devices not used to process the substrate represented by that respective column.

8. The method of any of embodiments 2 to 7, wherein determining the matrix comprises:

a. generating a first matrix, N, representing the possible combinations of the plurality of devices used to process a substrate;

b. determining a vector, $n_i$, for each row, i, of the first matrix, N;

c. calculating a delta covariance matrix, $\Delta Y_i$ for each row, wherein the delta covariance matrix is $n_i^T n_i$;

d. selecting a row, i, from the first matrix, N, and storing the selected row as a second matrix, M;

e. determining if a stopping criteria has been met, wherein:

if the stopping criteria is not met, continuing with step f using an updated first matrix, N, in which the selected row is removed; and if the stopping criteria is met, using the second matrix, M, as the determined matrix;

f. calculating the pseudo-determinant corresponding to each remaining row of the updated first matrix, N;

g. determining a row with a preferred pseudo-determinant, updating the second matrix, M, to include the row with the preferred pseudo-determinant, and updating the first matrix, N, by removing the row with the preferred pseudo-determinant;

h. determining if a stopping criteria has been met, wherein:

if the stopping criteria is not met, returning to step f using an updated first matrix, N, in which the row with the preferred pseudo-determinant is removed; and if the stopping criteria is met, the updated second matrix, M, is used as the determined matrix.

9. The method of embodiment 8, wherein the pseudo-determinant for each row is calculated by:

a. adding the delta covariance matrix, $\Delta Y_i$, for each row to a third matrix, Y, wherein the third matrix, Y, is the covariance of the second matrix, M;

b. calculating the determinant of the sum of the third matrix, Y, and the delta covariance matrix for the row, $\Delta Y_i$.

10. The method of embodiment 8 or embodiment 9, wherein a row of the first matrix, N, represents a possible combination of the plurality of devices used to process a substrate and a column of the first matrix, N, represents one of the plurality of devices.

11. The method of embodiment 10, wherein a row of the first matrix, N, has a non-zero entry corresponding to each of the plurality of devices used to process the substrate represented by that respective row, and a zero entry corresponding to each of the plurality of devices not used to process the substrate represented by that respective row.

12. The method of any of embodiments 8-11, wherein the optimum pseudo-determinant is the pseudo-determinant with the highest value.

13. The method of any of embodiments 8-12, wherein the row first selected in step d is a first row of the first matrix, N.

14. The method of any of embodiments 8-13, wherein the stopping criteria is met if a value of a performance parameter reaches a predetermined value, wherein optionally the performance parameter is one or more selected from:
    i. critical dimension, overlay, critical dimension uniformity, line edge placement, alignment, focus, pattern shift, line edge roughness, micro topology, and/or edge placement error; and/or
    ii. a shape description of a feature, such as side-wall angle, resist height, and/or contact hole ellipticity; and/or
    iii. a processing parameter such as a coating thickness, such as bottom anti-reflective coating thickness and/or resist thickness, and/or an optical property of a coating which may indicate a measure of absorption, such as refractive index and/or extinction coefficient; and/or
    iv. a parameter determined from substrate measurements, such as a yield parameter, such as defects and/or electrical performance.

15. The method of any of embodiments 8-14, wherein the stopping criteria is met if the number of rows used in the second matrix, M, reaches a predetermined value.

16. The method of any of embodiments 8-15, wherein the stopping criteria is met if all rows of the first matrix, N, are used in the second matrix, M.

17. The method of any of embodiments 2 to 16, wherein the matrix comprises at least one sub design matrix.

18. The method of embodiment 17, wherein the sub-design matrix may be a zero entry sub-design matrix or a non-zero sub-design matrix, wherein a zero entry sub-design matrix corresponds to the devices out of the plurality of devices not used to process the substrate and a non-zero sub-design matrix corresponds to each of the devices used to process the substrate, and a non-zero entry sub-design matrix is based on a modelled contribution to the fingerprint from the respective device and substrate.

19. The method of any of embodiments 2 to 18, wherein the equation comprising the matrix is solved using:
    i. least squares fit, optionally using regularization, and further optionally using an L-curve method and/or leave-one-out cross validation; and/or
    ii. Bayesian statistics.

20. The method of any of embodiments 1 to 19, further comprising analyzing variation of the parameter data using the usage data, and wherein determining the contribution to the parameter for a device comprises grouping the data using the analyzed variation.

21. The method of any of embodiments 1 to 20, wherein at least one of the devices is controlled based on the determined contribution to the fingerprint of the parameter of that device.

22. The method of any of embodiments 1 to 21, wherein the parameter is one or more selected from:
    i. critical dimension, overlay, critical dimension uniformity, line edge placement, alignment, focus, pattern shift, line edge roughness, micro topology, and/or edge placement error; and/or
    ii. a shape description of a feature, such as side-wall angle, resist height, and/or contact hole ellipticity; and/or
    iii. a processing parameter such as a coating thickness, such as bottom anti-reflective coating thickness and/or resist thickness, and/or an optical property of a coating which may indicate a measure of absorption, such as refractive index and/or extinction coefficient; and/or
    iv. a parameter determined from substrate measurements, such as a yield parameters, such as defects and/or electrical performance.

23. The method of any of embodiments 1 to 22, wherein the type of device comprises an etching device, a deposition tool, a substrate table, a polishing device, an annealing device, a cleaning device, a coating device, a developing device, an implantation device and/or a baking device.

24. The method of any of embodiments 1 to 23, wherein the parameter data may be the same as the measurements.

25. The method of any of embodiments 1 to 23, wherein the parameter data may be based on processed measurements, wherein the measurements are processed using principal component analysis or fitting of a model, such as a polynomial model or a linear model.

26. The method of any of embodiments 1 to 25, wherein each of the plurality of devices has been used to process at least one of the multiple substrates.

27. The method of any of embodiments 1 to 26, wherein there are at least two different classes of devices and wherein at least two classes comprise at least two devices of the same type.

28. A system comprising a processor configured to determine a contribution of a device out of a plurality of devices to a fingerprint of a parameter, the parameter being associated with processing of a substrate, the processor being configured to at least:
    obtain parameter data and usage data, wherein the parameter data is based on measurements for multiple substrates having been processed by the plurality of devices, and the usage data indicates which of the devices out of the plurality of devices were used in the processing of each substrate; and
    determine the contribution using the usage data and the parameter data.

29. A program to control determining a contribution of a device out of a plurality of devices to a fingerprint of a parameter, the parameter being associated with processing of a substrate, the program comprising instructions for carrying out at least:
    obtaining parameter data and usage data, wherein the parameter data is based on measurements for multiple substrates having been processed by the plurality of devices, and the usage data indicates which of the devices out of the plurality of devices were used in the processing of each substrate; and
    determining the contribution using the usage data and the parameter data.

CONCLUSION

In conclusion, the present disclosure describes a method for determining a contribution of a device to a fingerprint of a parameter. This allows the contribution from a single device out of a plurality of devices to be determined. This can be particularly useful for diagnosing performance of the devices used for processing a substrate and/or for controlling the devices used for processing a substrate.

The disclosed methods allow the provision of a lithographic apparatus and methods of operating a lithographic apparatus in which a contribution of a device to a fingerprint of a parameter is determined.

Any, or all of, the steps of determining a contribution of a device to a fingerprint of a parameter can be performed in any suitable processing apparatus, which may be located anywhere in the facility of FIG. 1, or may be physically remote from the facility. Steps of the method may be carried out in separate parts of the apparatus.

The contribution, parameter data and/or usage data may be calculated in the supervisory control system of FIG. 1, or in the litho tool control unit LACU. They may be calculated in a remote system and communicated to the facility afterwards. Any model and measurement data may be delivered separately to a processing apparatus which then combines them as part of determining the contribution.

The method and variations above are described as being carried out using a lithographic apparatus. However, one or more other apparatuses may be used. The processing step of a lithographic manufacturing process is only one example where the principles of the present disclosure may be applied. Other parts of the lithographic process, and other types of manufacturing process, may also benefit from the generation of modified estimates and corrections in the manner disclosed herein.

These and other modifications and variations can be envisaged by the skilled reader from a consideration of the present disclosure. The breadth and scope of the present invention should not be limited by any of the above-described exemplary embodiments, but should be defined only in accordance with the following claims and their equivalents.

The invention claimed is:

1. A method for determining a contribution of a device out of a plurality of devices to a fingerprint of a parameter, the parameter being associated with processing of a substrate, the method comprising:
obtaining parameter data and usage data, wherein the parameter data is based on measurements for multiple substrates having been processed by the plurality of devices, and the usage data indicates which of the devices out of the plurality of the devices were used in the processing of each substrate;
determining a matrix using the usage data; and
determining, by a hardware computer system, the contribution using the usage data and parameter data, the determining the contribution to the fingerprint comprises solving an equation comprising the matrix using the parameter data.

2. The method of claim 1, wherein the matrix equation is solved to determine the contribution of a device out of a plurality of devices by multiplying a transformed version of the matrix with the parameter data.

3. The method of claim 1, wherein a row of the matrix represents a substrate having been processed by at least one device in a first class of devices and at least one device in a second class of devices, and the column of the matrix represents one of the plurality of devices or wherein a column of the matrix represents a substrate having been processed by at least one device in a first class of devices and at least one device in a second class of devices, and a row of the matrix represents one of the plurality of devices.

4. The method of claim 1, wherein a row of the matrix has a non-zero entry corresponding to each of the devices used to process the substrate represented by that respective row, and a zero entry for the devices out of the plurality of devices not used to process the substrate represented by that respective row or wherein a column of the matrix has a non-zero entry corresponding to each of the devices used to process the substrate represented by that respective column, and a zero entry for the devices out of the plurality of devices not used to process the substrate represented by that respective column.

5. The method of claim 1, wherein determining the matrix comprises:
a. generating a first matrix, N, representing the possible combinations of the plurality of devices used to process a substrate;
b. determining a vector, $n_i$, for each row, i, of the first matrix, N;
c. calculating a delta covariance matrix, $\Delta Y_i$ for each row, wherein the delta covariance matrix is $n_i^T n_i$;
d. selecting a row, i, from the first matrix, N, and storing the selected row as a second matrix, M;
e. determining if a stopping criteria has been met, wherein:
if the stopping criteria is not met, continuing with step f using an updated first matrix, N, in which the selected row is removed; and
if the stopping criteria is met, using the second matrix, M, as the determined matrix;
f. calculating the pseudo-determinant corresponding to each remaining row of the updated first matrix, N;
g. determining a row with a preferred pseudo-determinant, updating the second matrix, M, to include the row with the preferred pseudo-determinant, and updating the first matrix, N, by removing the row with the preferred pseudo-determinant;
h. determining if a stopping criteria has been met, wherein:
if the stopping criteria is not met, returning to step f using an updated first matrix, N, in which the row with the preferred pseudo-determinant is removed; and
if the stopping criteria is met, the updated second matrix, M, is used as the determined matrix.

6. The method of claim 1, wherein the equation comprising the matrix is solved using:
i. least squares fit; and/or
ii. Bayesian statistics.

7. The method of claim 1, wherein at least one of the devices is controlled based on the determined contribution to the fingerprint of the parameter of that at least one device.

8. The method of claim 1, wherein the parameter is one or more selected from:
i. critical dimension, overlay, critical dimension uniformity, line edge placement, alignment, focus, pattern shift, line edge roughness, micro topology, and/or edge placement error; and/or
ii. a shape description of a feature; and/or
iii. a processing parameter; and/or
iv. a parameter determined from substrate measurements.

9. The method of claim 1, wherein the parameter data is based on processed measurements, and wherein the measurements are processed using principal component analysis or fitting of a model.

10. The method of claim 1, wherein the type of device comprises an etching device, a deposition tool, a substrate table, a polishing device, an annealing device, a cleaning device, a coating device, a developing device, an implantation device and/or a baking device.

11. The method of claim 1, wherein the parameter data is the same as the measurements.

12. The method of claim 1, wherein each of the plurality of devices has been used to process at least one of the multiple substrates.

13. The method of claim 1, wherein there are at least two different classes of devices and wherein at least two classes comprise at least two devices of a same type.

14. A system comprising a processor configured to determine a contribution of a device out of a plurality of devices to a fingerprint of a parameter, the parameter being associated with processing of a substrate and the processor configured to at least:
obtain parameter data and usage data, wherein the parameter data is based on measurements for multiple substrates having been processed by the plurality of devices, and the usage data indicates which of the devices out of the plurality of devices were used in the processing of each substrate;

determine a matrix using the usage data; and determine the contribution using the usage data and parameter data, the determination of the contribution to the fingerprint comprises solving of an equation comprising the matrix using the parameter data.

15. A computer program product to enable determination of a contribution of a device out of a plurality of devices to a fingerprint of a parameter, the parameter being associated with processing of a substrate, the computer program product comprising a non-transitory computer-readable medium having instructions therein, the instructions, upon execution by a computer system, configured to cause the computer system to at least:

obtain parameter data and usage data, wherein the parameter data is based on measurements for multiple substrates having been processed by the plurality of devices, and the usage data indicates which of the devices out of the plurality of devices were used in the processing of each substrate;

determine a matrix using the usage data; and determine the contribution using the usage data and parameter data, the determination of the contribution to the fingerprint comprises solving of an equation comprising the matrix using the parameter data.

16. The computer program product of claim 15, wherein the instructions are further configured to cause the computer system to provide an electronic signal configured to enable control of at least one of the devices based on the determined contribution to the fingerprint of the parameter of that at least one device.

17. The computer program product of claim 15, wherein the matrix equation is solved to determine the contribution of a device out of a plurality of devices by multiplying a transformed version of the matrix with the parameter data.

18. The computer program product of claim 15, wherein a row of the matrix represents a substrate having been processed by at least one device in a first class of devices and at least one device in a second class of devices, and the column of the matrix represents one of the plurality of devices or wherein a column of the matrix represents a substrate having been processed by at least one device in a first class of devices and at least one device in a second class of devices, and a row of the matrix represents one of the plurality of devices.

19. The computer program product of claim 15, wherein a row of the matrix has a non-zero entry corresponding to each of the devices used to process the substrate represented by that respective row, and a zero entry for the devices out of the plurality of devices not used to process the substrate represented by that respective row or wherein a column of the matrix has a non-zero entry corresponding to each of the devices used to process the substrate represented by that respective column, and a zero entry for the devices out of the plurality of devices not used to process the substrate represented by that respective column.

20. A computer program product to enable determination of a contribution of a device out of a plurality of devices to a fingerprint of a parameter, the parameter being associated with processing of a substrate, the computer program product comprising a non-transitory computer-readable medium having instructions therein, the instructions, upon execution by a computer system, configured to cause the computer system to at least:

obtain parameter data and usage data, wherein the parameter data is based on measurements for multiple substrates having been processed by the plurality of devices, and the usage data indicates which of the devices out of the plurality of devices were used in the processing of each substrate;

perform an ANOVA technique on the parameter data using the usage data, and determine the contribution using the usage data and the parameter data, the determination of the contribution comprising grouping of data using the analyzed variation from the performed ANOVA technique.

21. The computer program product of claim 20, wherein the instructions are further configured to cause the computer system to provide an electronic signal configured to enable control of at least one of the devices based on the determined contribution to the fingerprint of the parameter of that at least one device.

22. The computer program product of claim 20, wherein the type of device comprises an etching device, a deposition tool, a substrate table, a polishing device, an annealing device, a cleaning device, a coating device, a developing device, an implantation device and/or a baking device.

23. The computer program product of claim 20, wherein the parameter data is the same as the measurements.

24. The computer program product of claim 20, wherein each of the plurality of devices has been used to process at least one of the multiple substrates.

25. The computer program product of claim 20, wherein there are at least two different classes of devices and wherein at least two classes comprise at least two devices of a same type.

26. A method for determining a contribution of a device out of a plurality of devices to a fingerprint of a parameter, the parameter being associated with processing of a substrate, the method comprising:

obtaining parameter data and usage data, wherein the parameter data is based on measurements for multiple substrates having been processed by the plurality of devices, and the usage data indicates which of the devices out of the plurality of the devices were used in the processing of each substrate;

performing an ANOVA technique on the parameter data using the usage data, and determining the contribution using the usage data and the parameter data, the determining of the contribution comprising grouping of data using the analyzed variation from the performed ANOVA technique.

* * * * *